United States Patent [19]

Kim et al.

[11] Patent Number: 5,667,930
[45] Date of Patent: Sep. 16, 1997

[54] PHOTORESIST COMPOSITION CONTAINING 4,6-(BIS)CHLOROMETHYL-S-TRIAZINE INITIATOR

[75] Inventors: Bo Sung Kim; Soon Sik Kim, both of Seoul; Dae Woo Ihm, Daegu-Si, all of Rep. of Korea

[73] Assignee: Cheil Synthetics Incorporation, Kyongsangbuk, Rep. of Korea

[21] Appl. No.: 650,380

[22] Filed: May 20, 1996

[30] Foreign Application Priority Data

Aug. 31, 1995 [KR] Rep. of Korea .................. 95-27854

[51] Int. Cl.$^6$ .................................................. G03F 7/021
[52] U.S. Cl. ........................................ 430/176; 430/171
[58] Field of Search ...................................... 430/171, 176

[56] References Cited

U.S. PATENT DOCUMENTS

| | | |
|---|---|---|
| 4,189,323 | 2/1980 | Bahr .......................... 430/281 |
| 4,772,534 | 9/1988 | Kawamura et al. ........... 430/176 |
| 5,064,741 | 11/1991 | Koike et al. .................. 430/191 |
| 5,130,224 | 7/1992 | Kawabe et al. ............... 430/191 |

Primary Examiner—Christopher G. Young
Attorney, Agent, or Firm—Harrison & Egbert

[57] ABSTRACT

A photopolymerization photoresist composition having a binder resin, a multifunctional compound, a photopolymerization initiator, a sensitizer and other additives. The photopolymerization initiator has one or more 4,6-bis (chloromethyl)-s-triazine compound containing a diazophenyl group. The initiator acts as a chromophore and is represented by the following general formula I:

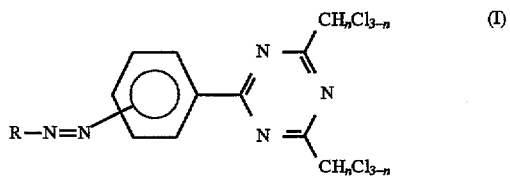

wherein the position at which the diazo group bonds to phenyl group may be changed. R is an aliphatic radical or an unsubstituted- or substituted aromatic radical and n is an integer of 0 to 2.

4 Claims, No Drawings

PHOTORESIST COMPOSITION CONTAINING 4,6-(BIS)CHLOROMETHYL-S-TRIAZINE INITIATOR

BACKGROUND OF THE INVENTION

1. Field of the Invention

The present invention relates, in general, to a photoresist composition containing a compound capable of generating halogen radical when exposed to radiant light and, more particularly, to the use of a 4,6-bis(halomethyl)-s-triazine having diazophenyl group therein, which acts as a chromophore, thereby improving the photosensitivity and the surface condition of the patterns formed.

2. Description of the Prior Art s-Triazine compound is known to generate halogen radical or acid when decomposed by radiant light, such as near uv and visible ray. It is useful for a plurality of purposes, particularly, including electronic material fields, such as chemical enhanced resist for semiconductor device memory, pigment-dispersing resist for liquid crystal display color filter, and dry film resist. Besides, s-triazine compound is added in a photoresist composition useful for facsimiles, copying and other picture forming systems. According to the purpose, such halogen radical- or acid-generating compound plays a role of radical photopolymerization initiator, acid-generating photopolymerization initiator, and photo-activator as acid catalyst.

Organic halogen compounds are decomposed by light to provide halogen radicals, such as chlorine and bromine. Since these halogen radicals have fast diffusion rates in photoresist composition in addition to being very active, photopolymerization efficiency is high when they react with vinyl groups containing double bond, allyl group, styryl group, acryl group or methacryl group, and cynamoyl group. Then, halogen radicals easily attract hydrogen atom from substrates, to generate hydrogen halides, which serve as acid donors, so that they can be used as an initiator for cation polymerization which reacts with vinyl ether group, epoxy group and styryl group. Also, halogen radicals lead to the conversion of functional groups present in bonding agents, serving as photo activators imparting functionality.

Well-known halogen radical-generating compounds include tetrachloro carbon, iodoform and tribromoacetephenone. These radical generators are decomposed by radiant light with very short wavelength. A photoresist composition which contains the halogen-generating compounds is sensitive to uv zone which is of shorter wavelength than those (300 nm to 450 nm) of typically used light sources. Thus, a significant problem of the halogen-generating compound is that it is difficult to generate radicals by radiant light.

In order to overcome these disadvantages, there were suggested halogen radical-generating compounds that have photosensitive zone ranging, in wavelength, from near uv to visible ray (300 nm–450 nm), a representative of which is halomethyl-s-triazine as illustrated in U.S. Pat. Nos. 3,954,475, 3,987,037, 4,189,323, 4,329,384, and 4,330,590. In spite of its ability to absorb the light of such wavelength zone, halomethyl-s-triazine has disadvantages in that the radical generation rate by photolysis and the photosensitivity of a photoresist composition comprising it both are relatively low.

SUMMARY OF THE INVENTION

Therefore, it is an object of the present invention to overcome the above problems encountered in prior arts and to provide a photoresist composition which is higher in stepguide numbers and film remaining rate.

It is another object of the present invention to provide a photoresist composition which is superior in photosensitivity.

It is a further object of the present invention to provide a photoresist composition which allows to give patterns with good surface condition.

Based on the intensive and thorough research by the present inventors, the above objects could be accomplished by a provision of a photoresist composition which comprises a photopolymerization initiator of one or more 4,6-bis(halomethyl)-s-triazine compounds containing a diazophenyl group, said initiator acting as a chromophore and being represented by the following general formula I:

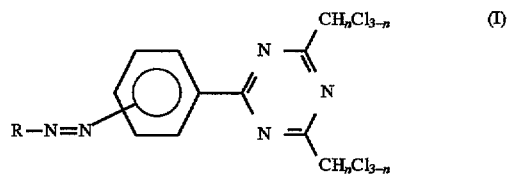

wherein the position at which the diazo group bonds to phenyl group may be changed;

R is an aliphatic radical or an unsubstituted- or substituted aromatic radical; and n is an integer of 0 to 2.

DETAILED DESCRIPTION OF THE INVENTION

In the photo-initiator of the general formula I, the aliphatic functional radical represented by R includes alkyl groups, such as methyl, ethyl, propyl and the like, alkoxy groups, such as methoxy, ethoxy, butoxy and the like, and other hydrocarbons with such functional group as ketone, ester and amine.

For aromatic functional radical of R, phenyl, 1-naphthyl, 2-naphthyl, 2-puryl, 2-oxazole, 2-thiazole, 2-imidazole, 2-pyridinyl, 2-benzopuryl, 2-benzothionyl, 2-benzoxazole, 2-benzothiazole, 2-benzoimidazole, benzotriazole, 2-indolyl and 2-quinolyl groups are available.

As substituted aromatic functional radical of R, the above aromatic groups which are substituted with the alkoxy group containing up to two carbon atoms, such as methoxy group and ethoxy group, halogen atom such as chlorine atom, nitro group, phenyl group, carboxyl group, hydroxy group, cyano group, and amine group, can be used, the concrete examples of which include 4-chlorophenyl, 2-chlorophenyl, 4-bromophenyl, 4-nitrophenyl, 3-nitrophenyl, 4-phenylphenyl, 2-methoxyphenyl, 4-methoxyphenyl, 4-ethoxyphenyl, 4-carboxyphenyl, 4-cyanophenyl, 2-cyanophenyl, 4-hydroxyphenyl, 2,4-dihydroxyphenyl, 4-(N,N-dimethylamino)-phenyl, 3,4-methylenedioxyphenyl, 4-phenoxyphenyl, 4-acetoxyphenyl, 4-methyl-1-naphthyl, 6-chloro-2-naphthyl, 4-bromo-2-naphthyl, 5-nitro-2-naphthyl, 6-methyl-2-benzoaryl, 6-methyl-2-benzoxazole, 6-methyl-2-benzothiazole, and 6-chloro-2-benzothiazole.

The s-triazine compounds represented as the general formula I can be prepared according to the following reaction scheme.

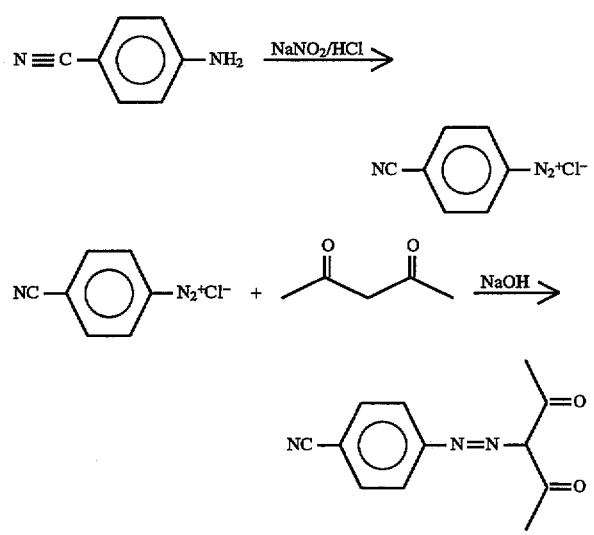
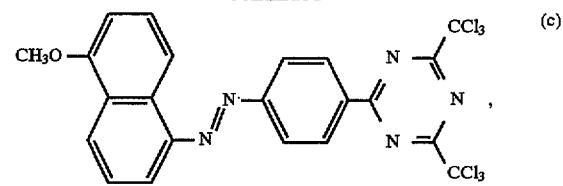
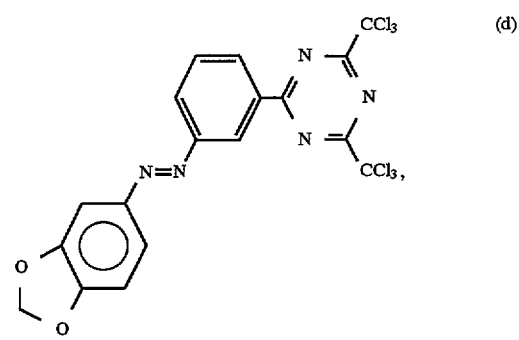

The starting material, triazine ring, can be synthesized using aromatic nitrile compound and haloacetonitrile, as illustrated in Bulletin of the Chemical Society of Japan, 42, 2924–2930 (1969) to K. Wakabkyashi.

4,6-bis(halomethyl)-s-triazine type racial-generating compounds useful as photopolymerization initiators in the present invention will be concretely exemplified by the following structural formulas:

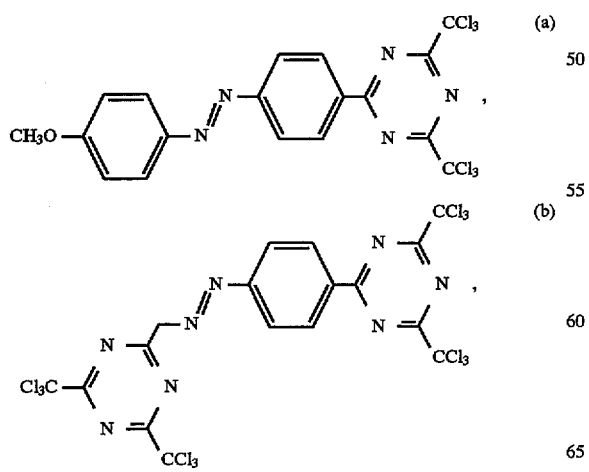
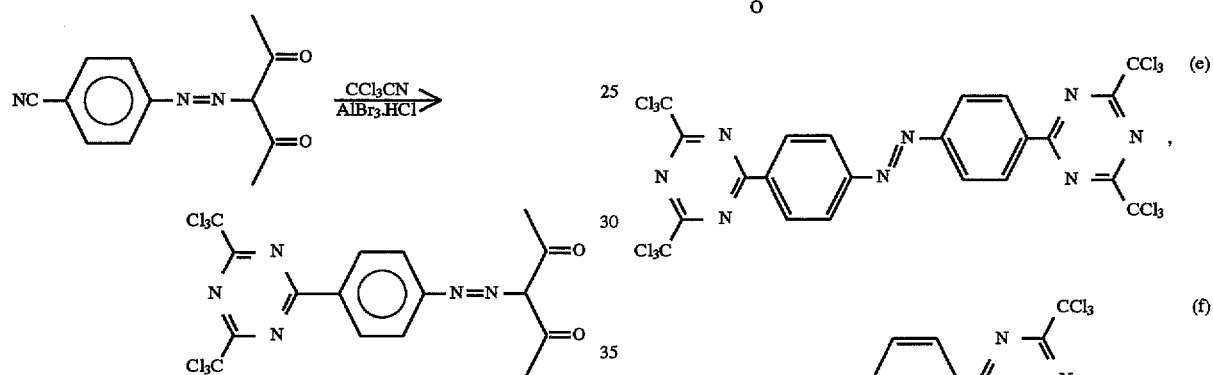
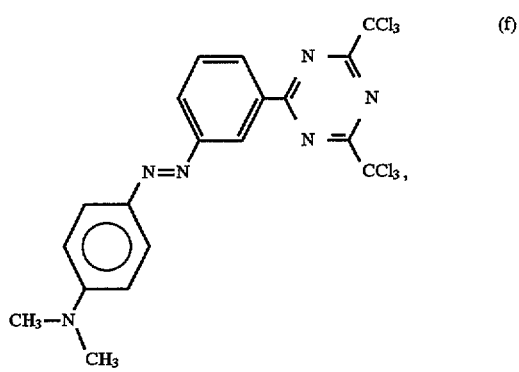
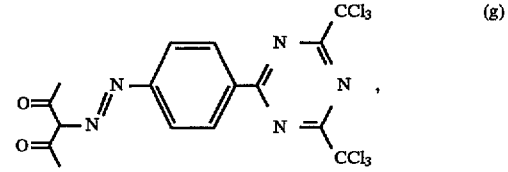
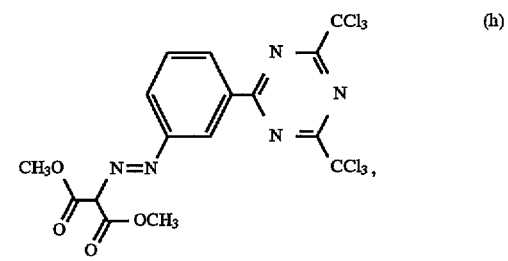

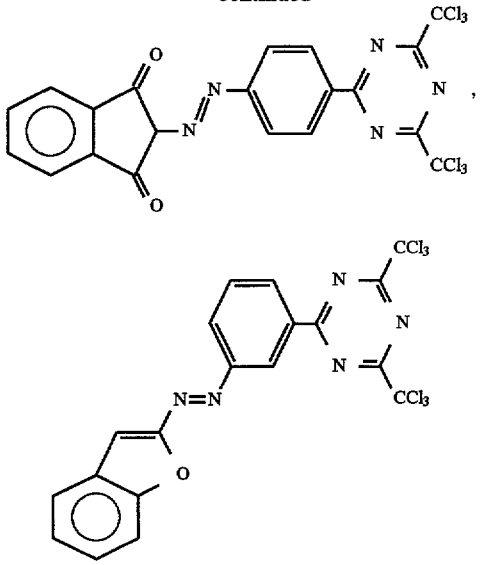

The above-illustrated radical-generating compounds may be used in photoresist compositions necessary to prepare plate print boards, integrated circuits and photomasks and, particularly, useful for photoresist layer of photosensitive print plate, color resist for liquid crystal display color filter and negative photoresist for semiconductor device, in addition to being employed as initiators in photopolymerizable compositions.

Characterized in using such photopolymerization initiators, the present invention is concerned with a photoresist composition which comprises a binder resin, a photopolymerizable multifunctional compound, a sensitizer and other additives.

It is required that the binder resin used in the present invention maintain superior compatibility with the photopolymerization initiator during all processes ranging, for example, from preparation of coating solution to coating and drying. Preferably, the binder resin has a good development property so that no residue remains on the surface of substrate after development. Another requisite for the binder resin is that the patterns formed be excellent in endurance after curing. Concrete examples of the binder include polystyrene, polyvinylalcohol, polyvinylchloride, polyacryl, polyester, polyimide, polyamide, polyamide (6-nylon, 6,6-nylon, etc.), copolymer of at least two species of alkyl acrylate or alkyl methacrylate monomers (in the case, alkyl group is selected from methyl, ethyl, n-butyl, isobutyl, n-hexyl, 2-hydroxyethyl, cyclohexyl, etc), copolymer of at least two species of aryl acrylate or aryl methacrylate monomers (in the case, aryl group is selected from phenyl, chlorophenyl, hydroxyphenyl, methoxyphenyl, nitrophenyl, benzyl, chlorobenzyl, hydroxybenzyl, nitrobenzyl, methoxybenzyl, naphthyl, etc.), copolymer of at least two species selected from the group consisting of acrylonitrile, vinyl chloride, styrene and butadiene monomers, copolymer of acrylonitrile and styrene, terpolymer of acrylonitrile, butadiene and styrene, a copolymer of alkyl methacrylate (alkyl group is the same as the above-mentioned compounds) and one or more species selected from acrylonitrile, vinyl chloride, styrene and butadiene monomers, copolymer of aryl methacrylate (aryl group is the same as the above-mentioned compounds) and one or more species selected from acrylonitrile, vinyl chloride, styrene and butadiene monomers, polystyrene, poly-alpha-methyl styrene, methyl cellulose, ethyl cellulose, and acetyl cellulose.

A copolymer resulting from admixture of water or alkali-soluble organic macromolecular polymer or addition of soluble monomer in the binder can be subjected to water- or alkali development. As the macromolecular polymers, there are addition polymers having carbonic acid at a side chain, for example, methacryl acid copolymers, such as copolymer of methyl methacrylate and methacrylic acid, copolymer of ethyl methacrylate and methacrylic acid, copolymer of butyl methacrylate and methacrylic acid, itaconic acid copolymers, crotonic acid copolymers, and partially esterified maleic acid copolymers, and acidic cellulose derivatives having carboxylic acid at a side chain.

These macromolecular polymers may independently be used as a binder resin. However, the combination of at least two species of the polymers results in a significant improvement in compatibility with the photopolymerization initiator as well as in endurance, resolution, thermal properties and bonding strength. Hence, it is preferred that two or more species of the macromolecular polymers as the binder resin are used at appropriate ratios.

The weight average molecular weight of the macromolecular polymers useful for the binder resin widely changes with type and ranges from about 1,000 to 1,000,000 and preferably from 10,000 to 100,000.

With regard to the photopolymerizable multifunctional compound, polymerizable monomer or prepolymer, that is, dimer, trimer or oligomer which contains at least one unsaturated double bond within its chemical structure is used. Concrete examples of this multifunctional compound include ethylene glycol diacrylate, triethylene glycol diacrylate, tetramethylene glycol diacrylate, pentaerythritol diacrylate, tetraethylene glycol diacryalte, trimethylolpropane triacrylate, trimethylol triacrylate, pentaerythritol tetraacrylate, dipentaerythritol triacrylate, dipentaerythritol tetraacrylate, dipentaerythritol hexaacrylate, sorbitol triacrylate, sorbitol tetraacrylate, sorbitol hexaacrylate, ethylene glycol dimethacrylate, triethylene glycol dimethacrylate, tetramethylene glycol dimethacrylate, pentaerythritol dimethacrylate, tetraethylene glycol dimethacrylate, trimethylolpropane trimethacrylate, trimethylol trimethacrylate, pentaerythritol trimethacrylate, dipentaerythritol trimethacrylate, pentaerythritol tetramethacrylate, dipentaerythritol hexamethacrylate, sorbitol trimethacrylate, sorbitol tetramethacrylate, sorbitol hexamethacrylate, bis(p-(3-methacryloxyproxy)phenyl) dimethylmethane, and bis(p-(methacryloxyepoxy)phenyl) dimethylmethane. Dimer or trimer of these compounds can be effectively used.

For sensitizer, a significant improvement can be made to photopolymerization rate upon using it along with the photopolymerization initiator represent by the general formula I. Concrete examples of the sensitizer include benzoin, benzoin methylether, benzoin ethylether, 9-fluorenone, 2-chlorofluorenone, 2-methyl-9-fluorenone, 9-anthrone, 2-bromo-9-anthrone, 2-ethyl-9-anthrone, 9,10-pentraquinone, 9,10-anthraquinone, 2-ethyl-9,10-anthraquinone, zanthone, 2-methylzanthone, 2-methoxyzanthone, thiozanthone, diethylthiozanthone, p-(dimethylamino)phenylstyrylketone, p-(dimethylamino)phenyl-p-methylstyrylketone, p-(dimethylamino)benzophenone, p-(diethylamino)benzophenone, and benzanthrone.

A better understanding of the present invention may be obtained in light of following examples which are set forth to illustrate, but are not to be construed to limit, the present invention.

EXAMPLES I THROUGH III

As a photopolymerization initiator, a compound of General Formula I was used as indicated in Table 1 below. Benzyl methacrylate/methacrylic acid (70/30) copolymer was used for a binder resin, and pentaerythritol tetraacrylate for multifunctional compound, diethylthiozanthone for sensitizer. These components were dissolved in propylene glycol monoethylether acetate/cyclohexanone (70/30). The solution thus obtained was spin-coated on a glass at a speed of 800 rpm for 10 seconds after which drying was carried out at 85° C. for 5 min. After being masked with a stepguide (15 steps), the coated photoresist solution was exposed to light with an energy of 100 mJ/cm$^2$), to obtain a pattern corresponding to the mask.

COMPARATIVE EXAMPLES I AND II

Photoresist patterns were obtained in the same manner with that of Example I with exception of using photopolymerization initiator as indicated in Table 1 below.

it is to be understood that within the scope of the appended claims, the invention may be practiced otherwise than as specifically described.

What is claimed is:

1. A photoresist composition in which the photoresist composition includes a binder resin and a multifunction compound and a sensitizer and a photopolymerization initiator, the photopolymerization initiator comprising one or more 4,6-bis(chloromethyl)-s-triazine compounds containing a diazophenyl group, said initiator acting as a chromophore and being represented by the following general formula I:

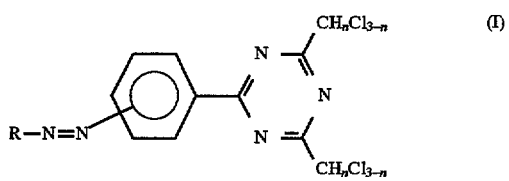

wherein the position at which the diazo group bonds to phenyl group may be changed;

R is an aliphatic radical or an unsubstituted- or substituted aromatic radical; and n is an integer of 0 to 2.

TABLE 1

| No. of Exam. | Photopolymerization Initiator | Step no. of Stepguide | Film Remaining Rate (%) | Surface Condition |
|---|---|---|---|---|
| I | Compound (a) | 9 | 97 | good |
| II | Compound (e) | 10 | 98 | good |
| II | Compound (i) | 10 | 89 | good |
| C.I | 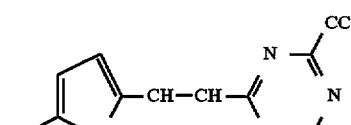 | 7 | 89 | ordinary |
| C.II | 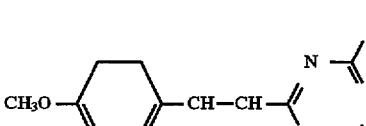 | 6 | 88 | ordinary |

Observations for film remaining rate and surface condition was made to the patterns obtained Examples I through III and Comparative Examples I and II and are given as shown in Table 1 below. As apparent from Table 1, the patterns according to the present invention are higher in stepguide numbers and film remaining rate than and, thus, of better photosensitivity than the conventional ones. Also, good surface condition of the patterns of the present invention demonstrates the superiority of the present invention to the conventional ones.

The present invention has been described in an illustrative manner, and it is to be understood the terminology used is intended to be in the nature of description rather than of limitation.

Many modifications and variations of the present invention are possible in light of the above teachings. Therefore, 2. A photoresist composition in accordance with claim 1, wherein R is an aliphatic radical selected from the group consisting of hydrocarbons that are the functional groups alkyl, alkoxy, ketone, ester and amine.

3. A photoresist composition in accordance with claim 1, wherein R is an unsubstituted aromatic radical selected from the group consisting of phenyl, 1-naphthyl, 2-naphthyl, 2-puryl, 2-oxazole, 2-thiazole, 2-imidazole, 2-pyridinyl, 2-benzopuryl, 2-benzothionyl, 2-benzoxazole, 2-benzothiazole, 2-benzoimidazole, benzotriazole, 2-indolyl, and 2-quinolyl.

4. A photoresist composition in accordance with claim 1, wherein said binder resin has a weight average molecular weight of between 10,000 and 100,000.

* * * * *